(12) United States Patent
Wang et al.

(10) Patent No.: US 10,523,094 B2
(45) Date of Patent: Dec. 31, 2019

(54) POWER INVERTER WITH LIQUID COOLED BUSBARS

(71) Applicant: Karma Automotive, LLC, Costa Mesa, CA (US)

(72) Inventors: Xiaogang Wang, Glendora, CA (US); Zhong Nie, San Mateo, CA (US); Yu Liu, Irvine, CA (US); Lei Gu, Irvine, CA (US)

(73) Assignee: KARMA AUTOMOTIVE LLC, Irvine, CA (US)

( * ) Notice: Subject to any disclaimer, the term of this patent is extended or adjusted under 35 U.S.C. 154(b) by 210 days.

(21) Appl. No.: 15/460,065

(22) Filed: Mar. 15, 2017

(65) Prior Publication Data
US 2018/0270994 A1    Sep. 20, 2018

(51) Int. Cl.
*H02K 11/33* (2016.01)
*H05K 7/20* (2006.01)
*H02M 7/00* (2006.01)
*H02K 9/19* (2006.01)

(52) U.S. Cl.
CPC ......... *H02K 11/33* (2016.01); *H05K 7/20981* (2013.01); *H02K 9/19* (2013.01); *H02M 7/003* (2013.01)

(58) Field of Classification Search
CPC ............ H02K 5/20; H02K 5/225; H02K 5/24; H02K 9/00; H02K 9/005; H02K 9/02; H02K 9/04; H02K 9/06; H02K 9/08; H02K 9/10; H02K 9/12; H02K 9/14; H02K 9/16; H02K 9/18; H02K 9/19; H02K 9/193; H02K 9/197; H02K 9/20; H02K 9/24; H02K 11/33; H02K 7/006; H02K 15/0068; H02K 2203/09; H02K 15/14; H05K 7/20981; H02M 7/003
USPC ..... 310/68 R, 89, 51, 52, 53, 54, 55, 57, 58, 310/59, 60 R, 61, 62, 63, 60 A, 64, 71
See application file for complete search history.

(56) References Cited

U.S. PATENT DOCUMENTS

| | | | |
|---|---|---|---|
| 5,491,370 A * | 2/1996 | Schneider | H02K 7/006 310/54 |
| 6,166,937 A | 12/2000 | Yamamura | |
| 8,520,386 B2 | 8/2013 | Bott | |
| 8,780,557 B2 | 7/2014 | Duppong | |
| 9,241,428 B1 | 1/2016 | Doo | |
| 2009/0161301 A1 | 6/2009 | Woody | |
| 2011/0122583 A1* | 5/2011 | Lowry | H01L 23/433 361/699 |
| 2013/0039009 A1 | 2/2013 | Shin | |

* cited by examiner

*Primary Examiner* — Mang Tin Bik Lian
*Assistant Examiner* — Alexander A Singh
(74) *Attorney, Agent, or Firm* — Gordon & Rees LLP

(57) ABSTRACT

A power inverter with liquid cooled busbars includes multiple AC power outlets. The power inverter also includes a busbar having a busbar arm connected to one of the AC power outlets, and a busbar leg having a first end connected to the busbar arm. The busbar leg is at least partially situated in a cooling channel of the power inverter, which may be a built-in cooling channel or a detachable cooling channel. A second end of the busbar leg extends beyond the cooling channel and is exposed for electrical connection.

20 Claims, 5 Drawing Sheets

100 # POWER INVERTER WITH LIQUID COOLED BUSBARS

BACKGROUND

The efficient delivery of electrical power for use in driving an electric motor is of ever increasing importance as the transition from fossil fuel based vehicle technologies to green vehicle technologies continues. Electric and electric hybrid vehicles, for example, typically utilize one or more power inverters to convert DC power received from a battery to AC power for use by electric motors to propel the vehicle.

One conventional approach for transferring AC power to an electric motor utilizes relatively long, flexible cables to connect the AC outputs of the power inverter to the electric motor. Although such a conventional approach offers thermal protection to the power inverter by distancing it from the electric motor, a significant disadvantage of the approach is the amount of space required for its implementation. As demand for electric and hybrid vehicles continues to grow, the need for a more compact solution for interfacing a power inverter with an electric motor that concurrently provides thermal protection for the power inverter becomes increasingly important.

SUMMARY

The present disclosure is directed to a power inverter with liquid cooled busbars, substantially as shown in and/or described in connection with at least one of the figures, and as set forth more completely in the claims.

DETAILED DESCRIPTION

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, the efficient delivery of electrical power for use in driving an electric motor is of ever increasing importance as the transition from fossil fuel based vehicle technologies to green vehicle technologies continues. As further stated above, as demand for electric and hybrid vehicles continues to grow, the need for a more compact solution for interfacing a power inverter with an electric motor that concurrently provides thermal protection for the power inverter becomes increasingly important.

The present application addresses the electrical power delivery challenges described above by disclosing an efficient, compact, and low cost solution for interfacing an electric motor with a power inverter. By enabling a substantially direct connection between the AC power outlets of a power inverter and the electric motor receiving the AC power, the present solution advantageously eliminates the cost and space requirements imposed by the conventional use of cables for accommodating a power inverter/motor interface. Moreover, by effectively cooling the high current carrying conductors connecting the power inverter to the motor, the present solution provides robust thermal protection for the transistors used to implement the power inverter.

Figure 1:
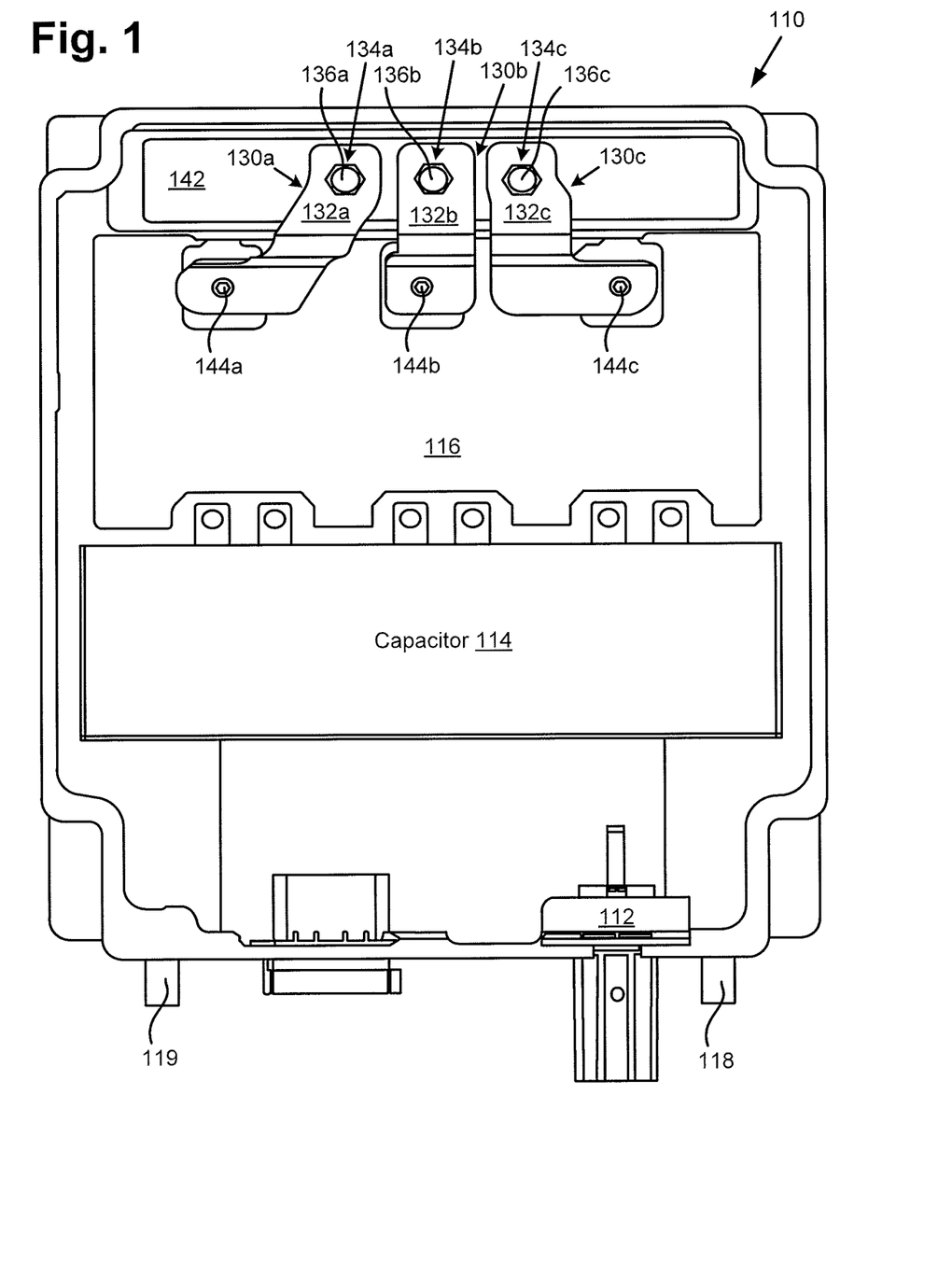
FIG. 1 shows an exemplary power inverter with liquid cooled busbars, according to one implementation.

FIG. 1 shows exemplary power inverter 110 with liquid cooled busbars, according to one implementation. As shown in FIG. 1, power inverter 110 includes DC power inlet 112, capacitor 114, power switching module 116, primary coolant inlet 118, primary coolant outlet 119, and AC power outlets 144a, 144b, and 144c. In addition, power inverter 110 includes busbars 130a, 130b, and 130c having respective busbar arms 132a, 132b, and 132c, and having respective busbar legs 134a, 134b, and 134c. Also shown in FIG. 1 are first ends 136a, 136b, and 136c of respective busbar legs 134a, 134b, and 134c, as well as cooling channel cover 142.

According to the exemplary implementation shown in FIG. 1, power switching module 116 is coupled to AC power outlets 144a, 144b, and 144c. In some implementations, power switching module 116 may be implemented as an array of power switches, such as insulated-gate bipolar transistors (IGBTs) for example, to convert DC power received by power inverter 110 at DC inlet 112 to AC power for delivery via AC outlets 144a, 144b, and 144c, and respective busbars 130a, 130b, and 130c.

Power inverter 110 may receive coolant, such as water or any suitable cooling fluid or fluid mix, such as Ethylene glycol water, for example, through primary coolant inlet 118, and may circulate the coolant through cooling channels internal to power inverter 110 (cooling channels not explicitly shown in FIG. 1) before being expelled through primary coolant outlet 119. In the implementation shown in FIG. 1, for example, such cooling channels include a built-in cooling channel underlying cooling channel cover 142 (the built-in cooling channel is obscured by cooling channel cover 142 from the perspective shown by FIG. 1). According to the present exemplary implementation, that built-in cooling channel underlying cooling channel cover 142 is configured to share coolant provided by primary coolant inlet 118 of power inverter 110.

As shown in FIG. 1, each of busbars 130a, 130b, and 130c has its busbar arm connected to a respective one of AC power outlets 144a, 144b, and 144c. Thus, busbar 130a has busbar arm 132a connected to AC power outlet 144a, busbar 130b has busbar arm 132b connected to AC power outlet 144b, and busbar 130c has busbar arm 132c connected to AC power outlet 144c.

Each of busbar legs 134a, 134b, and 134c has its respective first end 136a, 136b, and 136c connected to respective busbar arms 132a, 132b, and 132c. In addition, each of busbars legs 134a, 134b, and 134c is at least partially situated in the built-in cooling channel underlying cooling channel cover 142. Furthermore, second ends of respective busbar legs 134a, 134b, and 134c opposite first ends 136a, 136b, and 136c (second ends of busbar legs 134a, 134b, and 134c not visible from the perspective shown in FIG. 1) extend beyond the built-in cooling channel underlying cooling channel cover 142 so as to be exposed from power inverter 110 for electrical connection.

Busbars 130a, 130b, and 130c may be implemented using any materials, and having any dimensions, suitable to support AC power delivery by power inverter 110. For example, in some implementations, busbars 130a, 130b, and 130c may include a metal such as copper, or a first metal coated with a second metal, such as copper coated with tin. In addition, busbar arms 132a, 132b, and 132c, and busbar legs 134a, 134b, and 134c may be any regular or irregular shape. For example, busbar arms 132a, 132b, and 132c, and/or busbar legs 134a, 134b, and 134c may be rectangular, triangular, cylindrical, curved, or spiral for example. Moreover, busbars 130a, 130b, and 130c may be formed as one continuous piece, or busbar arms 132a, 132b, and 132c may be fastened or joined to respective busbar legs 134a, 134b, and 134c, such as through welding, for example.

Figure 2A:
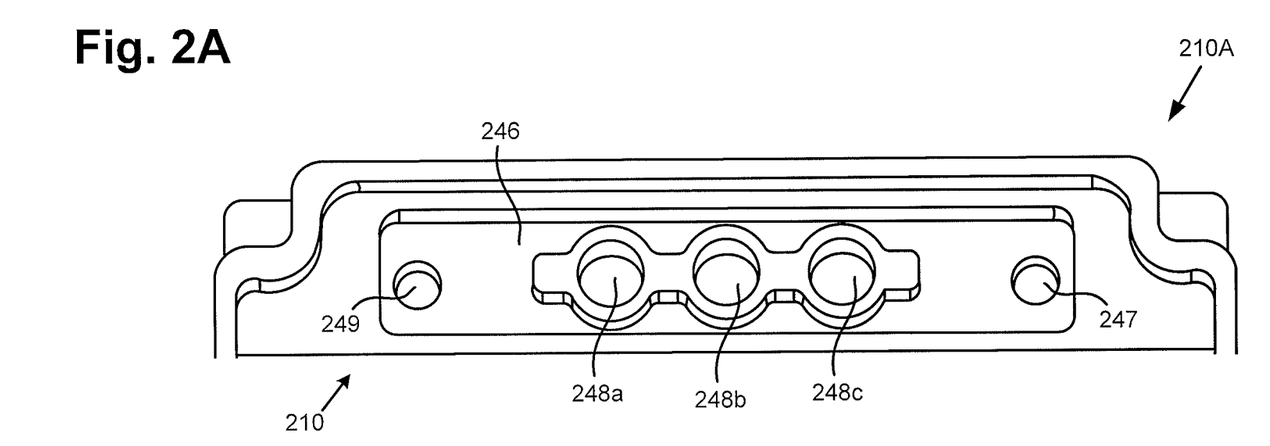
FIG. 2A shows an exemplary built-in cooling channel suitable for use in a power inverter with liquid cooled busbars, according to one implementation.

FIG. 2A shows exemplary built-in cooling channel 246 suitable for use in a power inverter with liquid cooled busbars, according to one implementation. Structure 210A, in FIG. 2A depicts a portion of power inverter 210 underlying cooling channel cover 142, in FIG. 1, and as though seen through cooling channel cover 142, busbar arms 132a, 132b, and 132c, and first ends 136a, 136b, and 136c of respective busbar legs 134a, 134b, and 134c, in FIG. 1.

Power inverter 210 corresponds in general to power inverter 110, in FIG. 1, and each of those corresponding features may share the characteristics attributed to either corresponding feature in the present disclosure. In other words, power inverter 110 may include a built-in cooling channel corresponding to and including the features of built-in cooling channel 246, in FIG. 2A. As shown in FIG. 2A, built-in cooling channel 246 includes coolant inlet 247, coolant outlet 249, and chambers 248a, 248b, and 248c for accommodating respective busbar legs 134a, 134b, and 134c.

Figure 2B:
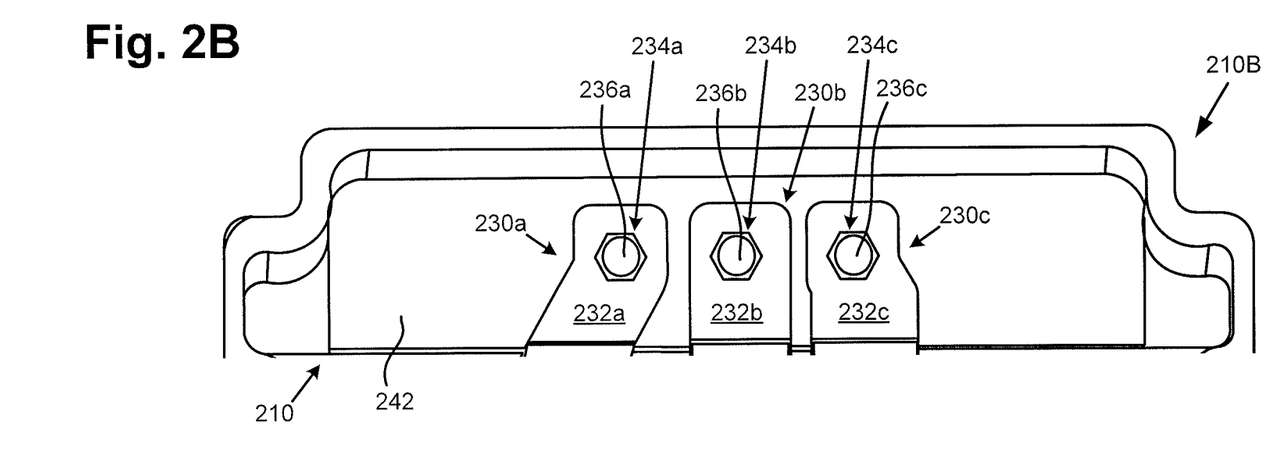
FIG. 2B shows another view of the exemplary structure shown in FIG. 2A, according to one implementation.

FIG. 2B shows another view of power inverter 210, as structure 210B, according to one implementation. In addition to the features shown and described by reference to FIG. 2A, FIG. 2B shows cooling channel cover 242, and busbars 230a, 230b, and 230c including respective busbar arms 232a, 232b, and 232c, and respective busbar legs 234a, 234b, and 234c. Also shown in FIG. 2B are first ends 236a, 236b, and 236c of respective busbar legs 234a, 234b, and 234c.

Cooling channel cover 242, and busbars 230a, 230b, and 230c, in FIG. 2B, correspond respectively in general to cooling channel cover 242 and busbars 130a, 130b, and 130c, in FIG. 1, and each of those corresponding features may share the characteristics attributed to either corresponding feature in the present disclosure. That is to say, in addition to first ends 236a, 236b, and 236c, each of respective busbar legs 234a, 234b, and 234c includes a second end opposite first ends 236a, 236b, and 236c. In addition, like busbar arms 132a, 132b, and 132c, and busbar legs 134a, 134b, and 134c, busbar arms 232a, 232b, and 232c, and/or busbar legs 234a, 234b, and 234c may be rectangular, triangular, cylindrical, curved, or spiral for example. Moreover, busbars 230a, 230b, and 230c may be formed as one continuous piece, or busbar arms 232a, 232b, and 232c may be fastened or joined to respective busbar legs 234a, 234b, and 234c, such as through welding, for example.

As shown by the combination of FIGS. 1, 2A, and 2B, each of busbar legs 134a/234a, 134b/234b, and 134c/234c has its respective first end 136a/236a, 136b/236b, and 136c/236c connected to respective busbar arms 132a/232a, 132b/232b, and 132c/232c. In addition, each of busbars legs 134a/234a, 134b/234b, and 134c/234c is at least partially situated in built-in cooling channel 246, for example, by being within respective chambers 248a, 248b, and 248c.

Thus, each of busbars legs 134a/234a, 134b/234b, and 134c/234c is in thermal contact with and cooled by liquid flowing in built-in cooling channel 246. Furthermore, second ends of respective busbar legs 134a/234a, 134b/234b, and 134c/234c opposite respective first ends 136a/236a, 136b/236b, and 136c/236c extend beyond built-in cooling channel 246, by passing through respective chambers 248a, 248b, and 248c, so as to be exposed from power inverter 110/210 for electrical connection. According to the present exemplary implementation represented by FIGS. 1, 2A, and 2B, built-in cooling channel 246 is configured to share and use the coolant provided by primary coolant inlet 118 of power inverter 110/210.

Figure 3:
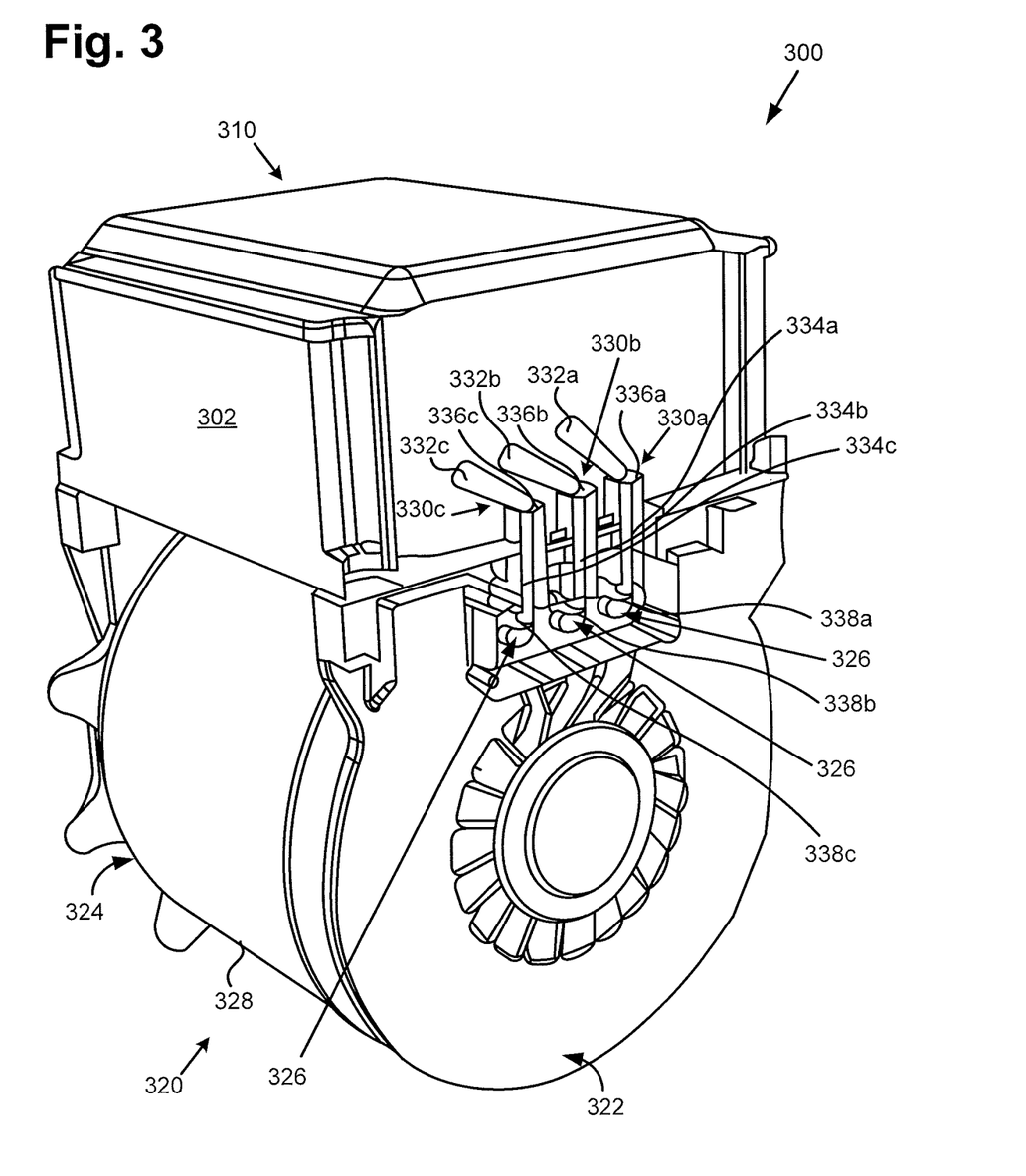
FIG. 3 shows an exemplary electrical machine including a power inverter with liquid cooled busbars, according to one implementation.

FIG. 3 shows exemplary electrical machine 300 including power inverter 310 with liquid cooled busbars, according to one implementation. As shown in FIG. 3, electrical machine 300 includes electric motor 320, and power inverter 310 situated over electric motor 320. As further shown in FIG. 3, power inverter 310 is interfaced with electric motor 320 via busbars 330a, 330b, and 330c.

According to the exemplary implementation shown in FIG. 3, electric motor 320 has first end 322, second end 324 opposite first end 322, motor end windings 326 accessible adjacent first end 322 of electric motor 320, and motor housing 328.

It is noted that power inverter 310 is depicted using a cut-away perspective in which a portion of power inverter housing 302 situated over first end 322 of electric motor 320 is removed to show busbars 330a, 330b, and 330c. It is further noted that features of power inverter 310 other than power inverter housing 302 and busbars 330a, 330b, and 330c are not shown in FIG. 3 in the interests of conceptual clarity.

Power inverter 310 corresponds in general to power inverter 110/210, in FIGS. 1, 2A, and 2B, and each of those corresponding features may share the characteristics attributed to any corresponding feature in the present disclosure. In other words, power inverter 310 may include features corresponding respectively to any or all of DC power inlet 112, capacitor 114, power switching module 116, primary coolant inlets 118, primary coolant outlet 119, cooling channel cover 142, and AC power outlets 144a, 144b, and 144c. Moreover, power inverter 310 may include a built-in cooling channel corresponding to and having all of the features of built-in cooling channel 246.

As is shown in FIG. 3, however, power inverter 310 includes busbars 330a, 330b, and 330c, each having a busbar arm, i.e., respective busbar arms 132a, 332b, and 332c, and each having a busbar leg, i.e., respective busbar legs 334a, 334b, and 334c. As also shown in FIG. 3, busbar legs 334a, 334b, and 334c have respective first ends 336a, 336b, and 336c connected respectively to busbar arms 332a, 332b, and 332c. In addition, busbar legs 334a, 334b, and 334c have respective second ends 338a, 338b, and 338c opposite respective first ends 336*a*, 336*b*, and 338*c*, and coupled to end windings 326 of electric motor 320.

Busbars 330*a*, 330*b*, and 330*c*, in FIG. 3, correspond respectively in general busbars 130*a*/230*a*, 130*b*/230*b*, and 130*c*/230*c*, in FIGS. 1 and 2B, and each of those corresponding features may share the characteristics attributed to any corresponding feature in the present disclosure. That is to say, in addition to first ends 136*a*/236*a*, 136*b*/236*b*, and 136*c*/236*c*, each of respective busbar legs 134*a*/234*a*, 134*b*/234*b*, and 134*c*/234*c* includes a second end opposite respective first ends 136*a*/236*a*, 136*b*/236*b*, and 136*c*/236*c* and corresponding respectively to second ends 338*a*, 338*b*, and 338*c*. In addition, like busbar arms 132*a*/232*a*, 132*b*/232*b*, and 132*c*/232*c*, and busbar legs 134*a*/234*a*, 134*b*/234*b*, and 134*c*/234*c*, busbar arms 332*a*, 332*b*, and 332*c*, and/or busbar legs 334*a*, 234*b*, and 334*c* may be rectangular, triangular, cylindrical, curved, or spiral for example. Moreover, busbars 330*a*, 330*b*, and 330*c* may be formed as one continuous piece, or busbar arms 332*a*, 332*b*, and 332*c* may be fastened or joined to respective busbar legs 334*a*, 334*b*, and 334*c*, such as through welding, for example.

Electrical machine 300 may be implemented as part of a power train of an electric or hybrid electric vehicle, for example. Thus, electric motor 320 may be a traction motor for driving a wheel axle of such a vehicle. In such an implementation, power inverter 110/210/310 may be used to receive DC power from a battery of the vehicle, to convert the DC power to AC power, and to output the AC power to electric motor 320 via busbars 130*a*/230*a*/330*a*, 130*b*/230*b*/330*b*, and 130*c*/230*c*/330*c*.

Thus, electric motor 320 is configured to receive AC power from power inverter 110/210/310. As a specific example, electric motor 320 may receive an AC output from power inverter 110/210/310 having an output voltage of about three hundred and fifty volts (350V), and an output current of about three hundred and eighty amperes (380 A). During operation, electric motor 320 generates substantial heat. End windings 326 of electric motor 320 may reach a temperature of approximately 150° C. to 160° C. during routine operation of electric motor 320.

Moreover, because second ends 338*a*, 338*b*, and 338*c* of respective busbar legs 134*a*/234*a*/334*a*, 134*b*/234*b*/334*b*, and 134*c*/234*c*/334*c* are electrically and thermally coupled to end windings 326 of electric motor 320, second ends 138*a*, 138*b*, and 138*c* of respective busbar legs 134*a*/234*a*/334*a*, 134*b*/234*b*/334*b*, and 134*c*/234*c*/334*c* too may be at or near a temperature of 150° C. or greater. However, the power switches typically utilized to implement power switching module 116 of power inverter 110/210/310 may experience thermal damage and/or failure at temperatures even lower than 150° C., such as at a temperature of approximately 110° C.

It is noted that although electrical machine 300 is depicted in FIG. 3 to include one electric motor and one power inverter, that representation is provided merely for conceptual clarity. In other implementations, electrical machine 300 may include more than one electric motor corresponding to electric motor 320, such as two electric motors for example, each interfaced with a respective power inverter such as power inverter 110/210/310.

Figure 4:
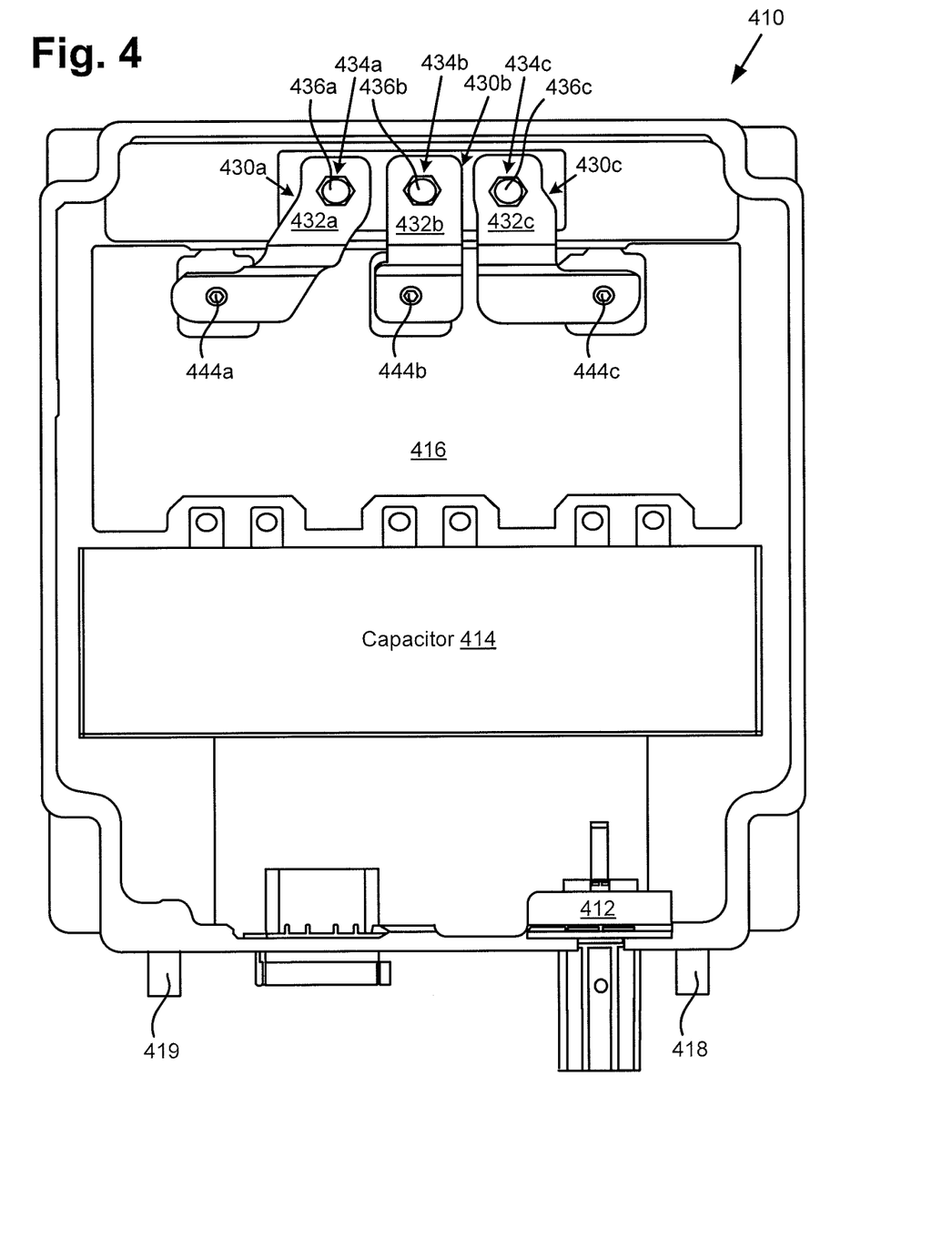
FIG. 4 shows an exemplary power inverter with liquid cooled busbars, according to another implementation.

FIG. 4 shows a more detailed view of exemplary power inverter 410 with liquid cooled busbars, according to another implementation. As shown in FIG. 4, power inverter 410 includes DC power inlet 412, capacitor 414, power switching module 416, primary coolant inlet 418, primary coolant outlet 419, and AC power outlets 444*a*, 444*b*, and 444*c*. In addition, power inverter 410 includes busbars 430*a*, 430*b*, and 430*c* having respective busbar arms 432*a*, 432*b*, and 432*c*, and having respective busbar legs 434*a*, 434*b*, and 434*c*. Also shown in FIG. 4 are first ends 436*a*, 436*b*, and 436*c* of respective busbar legs 434*a*, 434*b*, and 434*c*.

According to the exemplary implementation shown in FIG. 4, power switching module 416 is coupled to AC power outlets 444*a*, 444*b*, and 444*c*. In some implementations, power switching module 416 may be implemented as an array of power switches, such as IGBTs for example, to convert a DC input received by power inverter 110/410 at DC inlet 412 to AC power for delivery via AC outlets 444*a*, 444*b*, and 444*c*, and respective busbars 430*a*, 430*b*, and 430*c*. Power inverter 410 may receive coolant, such as water or any suitable cooling fluid or fluid mix, such as Ethylene glycol water, for example, through primary coolant inlet 418, and may circulate the coolant through cooling channels internal to power inverter 410 (cooling channels not explicitly shown in FIG. 4) before being expelled through primary coolant outlet 419.

As shown in FIG. 4, each of busbars 430*a*, 430*b*, and 430*c* has its busbar arm connected to a respective one of AC power outlets 444*a*, 444*b*, and 444*c*. Thus, busbar 430*a* has busbar arm 432*a* connected to AC power outlet 444*a*, busbar 430*b* has busbar arm 432*b* connected to AC power outlet 444*b*, and busbar 430*c* has busbar arm 432*c* connected to AC power outlet 444*c*. Moreover, each of busbar legs 434*a*, 434*b*, and 434*c* has its respective first end 436*a*, 436*b*, and 436*c* connected to respective busbar arms 432*a*, 432*b*, and 432*c*.

Busbars 430*a*, 430*b*, and 430*c* may be implemented using any materials, and having any dimensions, suitable to support AC power delivery by power inverter 410. For example, busbars 430*a*, 430*b*, and 430*c* may include a metal such as copper, or a first metal coated with a second metal, such as copper coated with tin. In addition, busbar arms 432*a*, 432*b*, and 432*c*, and busbar legs 434*a*, 434*b*, and 434*c* may be any regular or irregular shape. For example, busbar arms 432*a*, 432*b*, and 432*c*, and/or busbar legs 434*a*, 434*b*, and 434*c* may be rectangular, triangular, cylindrical, curved, or spiral for example. Moreover, busbars 430*a*, 430*b*, and 430*c* may be formed as one continuous piece, or busbar arms 432*a*, 432*b*, and 432*c* may be fastened or joined to respective busbar legs 434*a*, 434*b*, and 434*c*, such as through welding, for example.

Figure 5A:
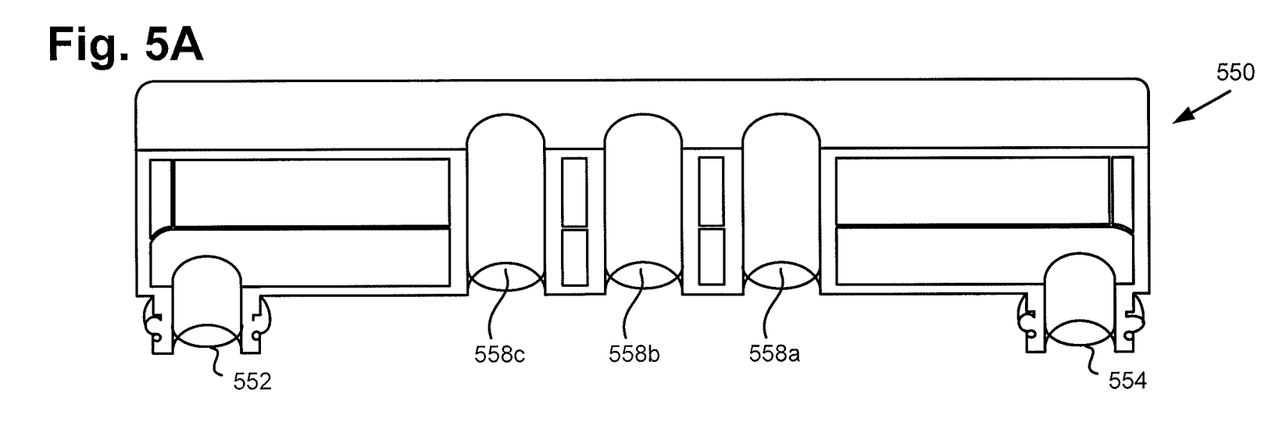
FIG. 5A shows an exemplary detachable cooling channel suitable for use as part of a power inverter with liquid cooled busbars, according to one implementation.

FIG. 5A shows exemplary detachable cooling channel 550 suitable for use as part of an power inverter with liquid cooled busbars, according to one implementation. As shown in FIG. 5A, detachable cooling channel 550 includes dedicated coolant outlet 552, dedicated coolant inlet 554, and chambers 558*a*, 558*b*, and 558*c* for accommodating busbar legs, such as respective busbar legs 434*a*, 434*b*, and 434*c*, in FIG. 4.

Detachable cooling channel 550 may receive coolant, such as water or any suitable cooling fluid or fluid mix, such as Ethylene glycol water, for example, through dedicated coolant inlet 554, may circulate the coolant through detachable cooling channel 550 and around chambers 558*a*, 558*b*, and 558*c*, and may expel the coolant through dedicated coolant outlet 552. It is noted that, in some implementations, detachable cooling channel 550 may share coolant received by power inverter 410 through primary coolant inlet 418. However, in other implementations, detachable cooling channel 550 may receive coolant through dedicated coolant inlet 554 independently of power inverter 410 and therefore may not share coolant received by power inverter 410 through primary coolant inlet 418.

Figure 5B:
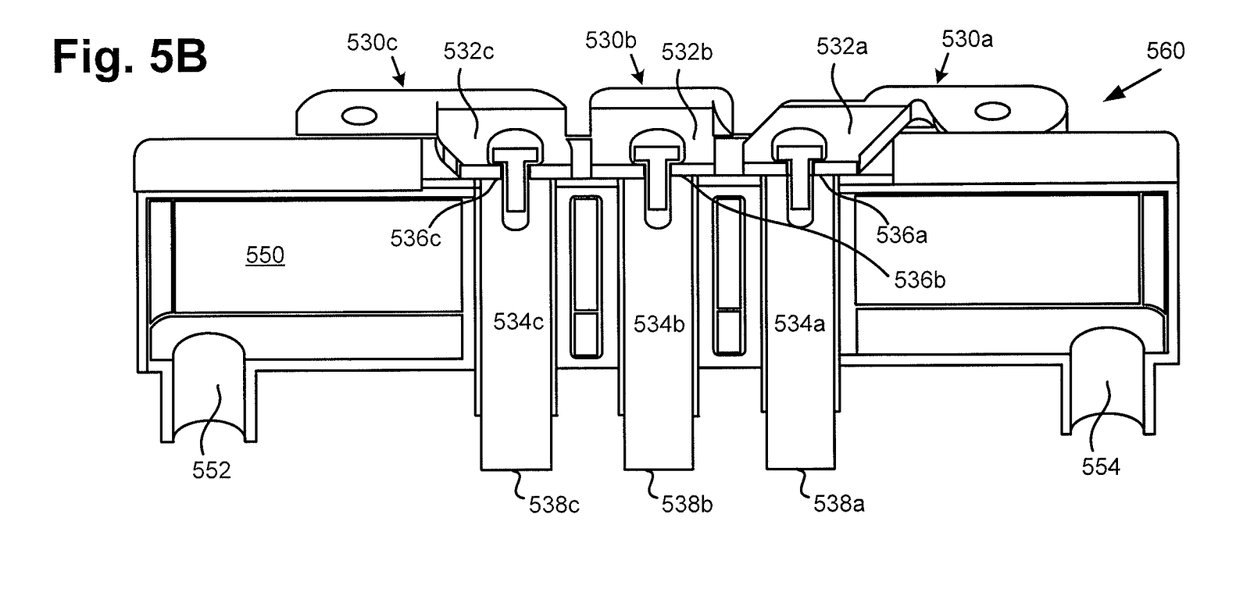
FIG. 5B shows a portion of an exemplary power inverter coupled to the detachable cooling channel of FIG. 5A, according to one implementation.

FIG. 5B shows a portion of structure 560 including detachable cooling channel 550, according to one implementation. In addition to the features shown and described by reference to FIG. 5A, FIG. 5B shows busbars 530a, 530b, and 530c including respective busbar arms 532a, 532b, and 532c, and respective busbar legs 534a, 534b, and 534c. Also shown in FIG. 5B are first ends 536a, 536b, and 536c, and second ends 538a, 538b, and 538c of respective busbar legs 534a, 534b, and 534c.

Busbars 530a, 530b, and 530c, in FIG. 5B, correspond respectively in general to busbars 430a, 430b, and 430b, in FIG. 4, and each of those corresponding features may share the characteristics attributed to either corresponding feature in the present disclosure. That is to say, like busbar arms 432a, 432b, and 432c, and busbar legs 434a, 434b, and 434c, busbar arms 532a, 532b, and 532c, and/or busbar legs 534a, 534b, and 534c may be rectangular, triangular, cylindrical, curved, or spiral for example. Moreover, busbars 530a, 530b, and 530c may be formed as one continuous piece, or busbar arms 532a, 532b, and 532c may be fastened or joined to respective busbar legs 534a, 534b, and 534c, such as through welding, for example.

As shown by the combination of FIGS. 4, 5A, and 5B, each of busbar legs 434a/534a, 434b/534b, and 434c/534c has its respective first end 436a/536a, 436b/536b, and 436c/536c connected to respective busbar arms 432a/532a, 432b/532b, and 432c/532c. In addition, each of busbars legs 434a/534a, 434b/534b, and 434c/534c is at least partially situated in detachable cooling channel 550, for example, by being within respective chambers 558a, 558b, and 558c.

Thus, each of busbars legs 434a/534a, 434b/534b, and 434c/534c is in thermal contact with and cooled by detachable cooling channel 550. Furthermore, second ends 538a, 538b, and 538c of respective busbar legs 434a/534a, 434b/534b, and 434c/534c extend beyond detachable cooling channel 550, by passing through respective chambers 558a, 558b, and 558c, so as to be exposed for electrical connection.

It is noted that in some use cases, power inverter 410 may be implemented in combination with an electric motor, such as electric motor 320, in FIG. 3. In such an implementation, detachable cooling channel 550 reduces a high temperature at end windings 326 to a low temperature at AC power outlets 444a, 444b, and 444c. For example, detachable cooling channel 550 may reduce a high temperature of between 150° C. and 160° C. at end windings 326 of electric motor 320 to a low temperature of less than or approximately equal to 110° C. at AC power outlets 444a, 444b, and 444c. As a result, detachable cooling channel 550 advantageously provides robust thermal protection to the power switches, such as IGBTs, implemented in power switching module 416 of power inverter 410.

Thus, the present application discloses an efficient, compact, and low cost solution for interfacing an electric motor with a power inverter. By enabling a substantially direct connection between the AC power outlets of a power inverter and the electric motor receiving the AC power, the present solution advantageously eliminates the cost and space requirements imposed by the conventional use of cables for mediating an inverter/motor interface. Moreover, by effectively cooling the high current carrying conductors, for example the busbars, connecting the power inverter to the motor, the present solution provides robust thermal protection for the transistors used to implement the power inverter.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A power inverter comprising:
a plurality of AC power outlets;
a busbar including a busbar arm connected to one of said plurality of AC power outlets;
said busbar including a busbar leg having a first end connected to said busbar arm, said busbar leg being at least partially situated in a built-in cooling channel, and a second end of said busbar leg extending beyond said built-in cooling channel, and being exposed for electrical connection;
said built-in cooling channel configured to share coolant provided by a primary coolant inlet of said power inverter, wherein the primary coolant inlet provides coolant in a primary flow path through the inverter to cool the inverter, and a secondary flow path through the built-in cooling channel to cool the busbar, wherein coolant flows through only one of the primary flow path and the secondary flow path.

2. The power inverter of claim 1, wherein said busbar leg is within a chamber in said built-in cooling channel.

3. The power inverter of claim 1, further comprising a power switching module for converting DC power to AC power.

4. The power inverter of claim 1, wherein said power inverter is part of an electrical machine, said electrical machine including an electric motor configured to receive AC power from said power inverter.

5. The power inverter of claim 1, wherein said power inverter is part of an electrical machine, said electrical machine further comprising:
an electric motor;
said second end of said busbar leg being coupled to an end winding of said electric motor;
said built-in cooling channel reducing a high temperature at said end winding to a low temperature at said one of said plurality of AC power outlets.

6. An electrical machine comprising:
an electric motor;
a power inverter configured to deliver AC power to said electric motor, the power inverter having a primary coolant inlet and a primary coolant outlet, said power inverter comprising:
a plurality of AC power outlets;
a busbar including a busbar arm connected to one of said plurality of AC power outlets, and a busbar leg having a first end connected to said busbar arm;
said busbar leg being at least partially situated in a built-in cooling channel, and a second end of said busbar leg extending beyond said built-in cooling channel and being coupled to an end winding of said electric motor;
said built-in cooling channel configured to share coolant provided by a primary coolant inlet of said power inverter, wherein the primary coolant inlet provides coolant in a primary flow path through the inverter to cool the inverter, and a secondary flow path through the built-in cooling channel to cool the busbar.

7. The electrical machine of claim 6, wherein said busbar leg is within a chamber in said built-in cooling channel.

8. The electrical machine of claim 6, wherein said power inverter further comprises a power switching module for converting DC power to said AC power.

9. The electrical machine of claim 6, wherein said power inverter is situated over said electric motor.

10. The electrical machine of claim 6, wherein said built-in cooling channel reduces a high temperature at said end winding to a low temperature at said one of said plurality of AC power outlets.

11. A power inverter comprising:
a plurality of AC power outlets;
a primary coolant inlet and a primary coolant outlet and a primary coolant path through the inverter to cool the inverter;
a busbar including a busbar arm connected to one of said plurality of AC power outlets;
said busbar including a busbar leg having a first end connected to said busbar arm, said busbar leg being at least partially situated in a detachable cooling channel for receiving coolant, and a second end of said busbar leg extending beyond said detachable cooling channel and being exposed for electrical connection, wherein the detacheable cooling channel provides a secondary flow path to cool the busbar, and wherein coolant only flows through one of the primary coolant path and the secondary flow path.

12. The power inverter of claim 11, wherein said busbar leg is within a chamber in said detachable cooling channel.

13. The power inverter of claim 11, further comprising a power switching module for converting DC power to AC power.

14. The power inverter of claim 11, wherein said power inverter is part of an electrical machine, said electrical machine including an electric motor configured to receive AC power from said power inverter.

15. The power inverter of claim 11, wherein said power inverter is part of an electrical machine, said electrical machine further comprising:
an electric motor;
said second end of said busbar leg being coupled to an end winding of said electric motor;
said detachable cooling channel reducing a high temperature at said end winding to a low temperature at said one of said plurality of AC power outlets.

16. An electrical machine comprising:
an electric motor;
a power inverter configured to deliver AC power to said electric motor, said power inverter comprising:
a plurality of AC power outlets;
a primary coolant inlet and a primary coolant outlet and a primary coolant path through the inverter to cool the inverter;
a busbar including a busbar arm connected to one of said plurality of AC power outlets, and a busbar leg having a first end connected to said busbar arm;
said busbar leg being at least partially situated in a detachable cooling channel, and a second end of said busbar leg extending beyond said detachable cooling channel and being coupled to an end winding of said electric motor, wherein the detacheable cooling channel provides a secondary flow path of coolant to cool the busbar.

17. The electrical machine of claim 16, wherein said busbar leg is within a chamber in said detachable cooling channel.

18. The electrical machine of claim 16, further comprising a power switching module for converting DC power to said AC power.

19. The electrical machine of claim 16, wherein said power inverter is situated over said electric motor.

20. The electrical machine of claim 16, wherein said detachable cooling channel reduces a high temperature at said end winding to a low temperature at said one of said plurality of AC power outlets.

\* \* \* \* \*